United States Patent
Kanechika et al.

(10) Patent No.: US 8,148,283 B2
(45) Date of Patent: Apr. 3, 2012

(54) ALUMINUM NITRIDE SINTERED BODY

(75) Inventors: Yukihiro Kanechika, Shunan (JP);
Masanobu Azuma, Shunan (JP)

(73) Assignee: Tokuyama Corporation, Shunan-shi (JP)

( * ) Notice: Subject to any disclaimer, the term of this patent is extended or adjusted under 35 U.S.C. 154(b) by 74 days.

(21) Appl. No.: 12/525,224

(22) PCT Filed: Feb. 4, 2008

(86) PCT No.: PCT/JP2008/051780
§ 371 (c)(1),
(2), (4) Date: Jul. 30, 2009

(87) PCT Pub. No.: WO2008/093871
PCT Pub. Date: Aug. 7, 2008

(65) Prior Publication Data
US 2010/0093514 A1    Apr. 15, 2010

(30) Foreign Application Priority Data
Feb. 2, 2007    (JP) .................. 2007-024622

(51) Int. Cl.
*C04B 35/581* (2006.01)

(52) U.S. Cl. .................. 501/98.4; 501/98.5

(58) Field of Classification Search ........... 501/98.4, 501/98.5, 98.6
See application file for complete search history.

(56) References Cited

U.S. PATENT DOCUMENTS

| | | | |
|---|---|---|---|
| 4,847,221 A | 7/1989 | Horiguchi et al. | |
| 4,950,435 A | 8/1990 | Taniguchi et al. | |
| 5,242,872 A | 9/1993 | Taniguchi et al. | |
| 7,081,425 B2 * | 7/2006 | Kanechika et al. | 501/98.4 |
| 7,341,969 B2 * | 3/2008 | Natsuhara et al. | 501/98.4 |
| 2005/0070421 A1 * | 3/2005 | Kanechika et al. | 501/98.4 |
| 2007/0272938 A1 | 11/2007 | Maeda et al. | |
| 2009/0041961 A1 * | 2/2009 | Kanechika et al. | 428/34.4 |

FOREIGN PATENT DOCUMENTS

| | | |
|---|---|---|
| EP | 1518843 A2 | 3/2005 |
| JP | 63025278 A | 2/1988 |
| JP | 2829247 B2 | 9/1998 |
| JP | 2856734 B2 | 11/1998 |
| WO | 2006013899 A1 | 2/2006 |
| WO | 2007018140  * | 2/2007 |

OTHER PUBLICATIONS

Slack, G.A. et al., "AlN Single Crystals", J. Cryst. Growth, 1976, pp. 263-279, vol. 34, No. 2, North-Holland Publishing Co.
Miyanaga, Michimasa et al., "AlN Single Crystal Growth by Sublimation Method", SEI Technical Review, Mar. 2006, pp. 103-106, vol. 168.

* cited by examiner

*Primary Examiner* — Karl Group
(74) *Attorney, Agent, or Firm* — The Webb Law Firm

(57) ABSTRACT

A high-purity aluminum nitride sintered body is provided by efficiently removing oxides contained in a raw material powder in producing an aluminum nitride sintered body and preventing composite oxide produced by reaction of oxides contained in the raw material powder with a sintering aid from remaining in the aluminum nitride sintered body. The above sintered body is achieved by an aluminum nitride sintered body having a concentration of residual oxygen excluding attached oxygen of 350 ppm or less.

3 Claims, No Drawings

ALUMINUM NITRIDE SINTERED BODY

TECHNICAL FIELD

The present invention relates to a high-purity aluminum nitride sintered body and a production process for the same.

BACKGROUND ART

Since blue light emitting diodes prepared by using a nitride semiconductor have been developed, requirements to a rise in the performances of light emitting diodes are rapidly increasing. At present, gallium nitride (GaN) is suitably used as a material for light emitting diodes and semiconductor lasers which emit blue light, and it has been important to further enhance the performances of GaN devices.

In general, in order to obtain nitride semiconductor devices having such excellent device performances that the emission output is high and that dispersion of an emission wavelength is small, it is important to provide a high-quality nitride crystal itself constituting the device. Nitride semiconductor devices have so far been produced by allowing a nitride crystal to grow heteroepitaxially on a single crystal substrate such as sapphire to form a nitride crystal body. In order to form a high quality nitride crystal, the lattice mismatch between a substrate and a nitride crystal has to be reduced in order to inhibit forming of a crystal defect of the nitride crystal. A method in which an aluminum nitride single crystal film as a buffer film is formed on a substrate such as sapphire and a nitride crystal as a semiconductor device is formed thereon is known as a method for reducing the lattice mismatch between a substrate and nitride crystal.

A sublimation method attracts as a promising production technology for an aluminum nitride single crystal film as a buffer film (non-patent documents 1 and 2). The sublimation method is a growing method in which a raw material is sublimated at high temperature to reprecipitate crystal on a cold part. However, when the raw material has a low purity, impurities are sublimated as well. Consequently, the quality of the resulting single crystal film becomes low as well and a nitride crystal which is formed thereon and becomes a semiconductor device is also reduced in quality. Accordingly, a high-quality aluminum nitride is required for a raw material used in the sublimation method.

In aluminum nitride, an oxide layer (alumina component) is unavoidably formed on a surface. Such alumina component causes as well a reduction in a quality of a single crystal film obtained by the sublimation method. Accordingly, it is not necessarily suitable to use an aluminum nitride powder having a large surface area as a raw material used in the sublimation method.

On the other hand, an aluminum nitride sintered body has a small surface area as compared with that of a powder having the same weight, and therefore has a surface oxide in small amount. Accordingly, it is investigated to use the aluminum nitride sintered body as a raw material for growing single crystal by the sublimation method.

Various high-purity aluminum nitride sintered bodies have already been known, though they are not intended to use as a raw material for growing single crystal by the sublimation method (for example, patent documents 1 to 3). However, oxides originating in a sintering aid are contained in high-purity aluminum nitride sintered bodies in many cases. That is, aluminum oxide present in an aluminum nitride powder as a raw material or on a surface of the powder forms composite oxide with the sintering aid and the above composite oxide is precipitated on a grain boundary of an aluminum nitride crystal to result in a sintered body containing oxygen, metal components and the like which constitute the composite oxide. For example, patent document 1 discloses an aluminum nitride sintered body having an oxygen concentration of 0.05% by weight and a rare earth metals concentration of 240 ppm; patent document 2 discloses an aluminum nitride sintered body having an oxygen concentration of 300 ppm and a rare earth metals concentration of 50 ppm and an aluminum nitride sintered body having an oxygen concentration of 500 ppm and a rare earth metals concentration of 0.01 ppm; and patent document 3 discloses an aluminum nitride sintered body having an oxygen concentration of 300 ppm and a rare earth metals concentration of 50 ppm.

Such oxygen and metal components cause as well a reduction in the quality of a single crystal film obtained by sublimation method. Accordingly, when a high-purity aluminum nitride sintered body is used as a raw material for growing single crystal by sublimation method, the amount of composite oxide originating in a sintering aid has to be reduced.

Patent document 1: JP-A 1988-25278
Patent document 2: JP-B 2856734
Patent document 3: JP-B 2829247
Non-patent document 1: G. A. Slack and T. F. McNelly, "AlN single crystals", J. Cryst. Growth 34(1976) 263
Non-patent document 2: M. Miyanaga at al., "AlN Single Crystal Growth by Sublimation Method", SEI Technical Review, No. 168 (March, 2006), 103

In burning an aluminum nitride powder, a sintering aid is reacted with oxide contained in the raw material powder to form composite oxide, and therefore an aluminum nitride crystal itself is purified. However, the composite oxide is precipitated on a grain boundary of the aluminum nitride crystal, and therefore a purity of an aluminum nitride sintered body as a bulk does not necessarily become high. Accordingly, an object of the present invention is to provide a high-purity aluminum nitride sintered body by efficiently removing oxides contained in a raw material powder and preventing composite oxide produced by reaction of oxides contained in the raw material powder with a sintering aid from remaining in an aluminum nitride sintered body in producing the aluminum nitride sintered body.

The present inventors have intensively investigated to remove composite oxide from the sintered body and have paid attentions on alkaline earth aluminates as a sintering aid.

It has so far been known that alkaline earth oxides are effective as a sintering aid.

It is considered that, in a sintering step, a sintering aid reacts with aluminum oxide (alumina) contained in an AlN powder to form a liquid phase and to discharge oxygen contained in the AlN powder to a grain boundary of AlN crystal in the form of composite oxide. As a result, the AlN crystal is considered to be purified. Among alkaline earth oxides, particularly, alkaline earth aluminates are considered to have a high reactivity with AlN crystal and to have essentially a high ability to purify the AlN crystal because they can form readily and evenly the liquid phase.

Also, oxygen contained in a raw material powder is considered to be discharged outside AlN crystal in the form of composite oxide with alkaline earth aluminate. The above composite oxide is considered to be more readily volatilized than composite oxide of oxygen with a rare earth oxide auxiliary contained in the raw material powder.

Further, alkaline earth aluminate is liable to be volatile as compared with a rare earth oxide auxiliary. Therefore, it is considered that the alkaline earth aluminate itself is also liable to be removed outside an AlN sintered body at a later stage of a sintering step of AlN so that oxygen originating in the alkaline earth aluminate is less liable to remain in the sintered body.

However, it is considered to be difficult for the alkaline earth aluminate to remains in AlN crystal for a sufficiently long time to thereby trap oxygen from the crystal since the alkaline earth aluminate is liable to be volatile.

SUMMARY OF THE INVENTION

The present inventors have found that use of a raw material AlN powder having a low concentration of residual oxygen and a larger amount of alkaline earth aluminate than ever as a sintering aid and employment of specific sintering conditions allow oxygen in AlN crystal to be thoroughly removed similarly to the case in which a rare earth oxide auxiliary such as $Y_2O_3$ is used as a sintering aid and allow oxygen originating in the raw material powder and oxygen and metal components originating in the alkaline earth aluminate to be removed also from a grain boundary of AlN, whereby the problems described above are solved. The present invention has been completed based on these findings.

That is, the gist of the present invention which solves the above problems stays is as follows.

[1] An aluminum nitride sintered body having a concentration of residual oxygen excluding attached oxygen of 350 ppm or less.
[2] The aluminum nitride sintered body as described in the above item [1], having a concentration of residual oxygen including attached oxygen of 700 ppm or less and not substantially containing metal elements other than aluminum.
[3] The aluminum nitride sintered body as described in the above item [2], having a concentration of the metal components other than aluminum of 100 ppm or less in total.
[4] The aluminum nitride sintered body as described in the above item [2] or [3], having a concentration of rare earth metal elements of 1 ppm or less.
[5] A production process for the aluminum nitride sintered body of any of the above items [1] to [4], comprising:
molding a mixed powder that comprises an aluminum nitride powder having a concentration of residual oxygen of 0.9% or less and an alkaline earth aluminate containing an alkaline earth metal atom of 0.6 to 2.1 mole per mole of an oxygen atom contained in the aluminum nitride powder into a prescribed form and
having the resulting molded product put in a carbon-made vessel, placed without being brought into direct contact with the carbon and then sintered at a temperature of 1700 to 2100° C. for 10 to 100 hours.
[6] The production process for the aluminum nitride sintered body as described in the above item [5], wherein the aluminum nitride powder has a concentration of impurity metal components other than aluminum of 50 ppm or less.
[7] The production process for the aluminum nitride sintered body as described in the above item [5] or [6], wherein the alkaline earth aluminate is $3CaO \cdot Al_2O_3$.

ADVANTAGEOUS EFFECTS OF THE INVENTION

Oxide contained in the raw material powder is liable to form composite oxide with the sintering aid by using a relatively large amount of an alkaline earth aluminate as the sintering aid. Accordingly, oxide contained in the raw material can efficiently be removed, and the aluminum nitride crystal can be purified.

Also, sintering which is carried out in a carbon vessel results in allowing the molded product and the sintered body to be exposed to a strong reducing atmosphere. As a result, the composite oxide is liable to be volatile, and an amount of the residual composite oxide in the sintered body can be reduced.

According to the present invention, the amount of oxygen and metal components originating in the raw material powder and the sintering aid is reduced, whereby a high-purity aluminum nitride sintered body is provided.

The above high-purity aluminum nitride sintered body can preferably be used as a raw material for growing single crystal by a sublimation method.

BEST MODE FOR CARRYING OUT THE INVENTION

The aluminum nitride (hereinafter also referred to as "AlN") sintered body according to the present invention is characterized by having a concentration of residual oxygen excluding attached oxygen of 350 ppm or less. In the present specification, "%" and "ppm" which are units of the various concentrations are based on weight.

Preferably, the AlN sintered body according to the present invention has a concentration of residual oxygen of 700 ppm or less and does not substantially contain metal elements other than aluminum.

That is, preferably, the AlN sintered body of the present invention has a monolithic composition in which 99.9% or more of the composition is AlN and does not substantially contain a surface oxide film or a composite oxide originating in the sintering aid while the AlN crystal phase maintains a polyhedral particle form close to a spherical form.

The residual oxygen is a total amount of oxygen including attached oxygen in AlN.

For example, in the AlN sintered body, the residual oxygen is a total of a surface oxide film, a composite oxide which is originating in the sintering aid and is precipitated on the grain boundary, oxygen which is solid-solubilized in the crystal and attached oxygen. A concentration thereof is more preferably 600 ppm or less, further preferably 500 ppm or less and particularly preferably 300 ppm or less. A lower concentration of the residual oxygen is more preferred, and therefore the lower limit thereof shall not specifically be restricted. However, a technical limit value thereof in terms of production is about 100 ppm.

In the AlN powder, the residual oxygen is a total of a surface oxide layer, oxygen which is solid-solubilized in the crystal and attached oxygen.

The concentration of the residual oxygen is determined by melting targeted AlN in an inert gas by an impulse heating melting method to extract oxygen, converting the extracted oxygen into the form of carbon monoxide and measuring this carbon monoxide by means of a non-dispersive infrared detector. In the case of the AlN sintered body, it is measured in the following manner specifically.

First, the AlN sintered body is crushed, and about 35 mg of the AlN crushed lump is weighed. The AlN crushed lump is put in a nickel capsule, and tin pellets are put therein. The above nickel capsule is squashed by means of a nipper to prepare a sample for measurement. Nickel and tin work as a decomposition accelerating agent for AlN.

Next, the sample for measurement is put in a crucible made of graphite which is set in an oxygen/nitrogen analyzer and which is degassed in advance by heating, and an electric current is allowed to pass through the above graphite crucible. The graphite crucible is heated quickly to high temperature by Joule heating. Carbon monoxide is produced by reaction of the graphite crucible with oxygen contained in the AlN sintered body. A concentration of this carbon monoxide is measured by means of a non-dispersive infrared detector to determine a concentration of the residual oxygen.

The concentration of the residual oxygen measured by the method described above includes oxygen attached on the sample surface in preparing and measuring the sample. In using the AlN sintered body as a single crystal-growing raw material, the amount of the attached oxygen does not necessarily have an important meaning. That is, in a single crystal-growing device, single crystal is grown after a high level of atmospheric substitution. Therefore, the attached oxygen is discharged outside the device, so that the effect exerted on a quality of a single crystal film by the attached oxygen is small. The effect of an oxide film on the surface of the AlN sintered body and a composite oxide which is originating in the sintering aid and is precipitated on a grain boundary is rather large.

Accordingly, the propriety of the AlN sintered body as a single crystal-growing raw material is more suitably evaluated by a concentration of the residual oxygen excluding the attached oxygen, that is, by an amount of oxides based on the surface oxide film of the AlN sintered body, the composite oxide which is originating in the sintering aid and is precipitated on the grain boundary and oxygen which is solid-solubilized in the crystal.

Therefore, the concentration of residual oxygen excluding attached oxygen in the AlN sintered body of the present invention is 350 ppm or less, preferably 300 ppm or less and more preferably 100 ppm or less. A lower concentration of the residual oxygen excluding the attached oxygen is more preferred, and therefore the lower limit thereof is not specifically restricted. However, a technical limit value thereof in terms of production is about 50 ppm.

The concentration of the residual oxygen excluding the attached oxygen is determined in the following manner. That is, oxygen extracted by the impulse heating melting method as described above is measured in the form of carbon monoxide by means of a non-dispersive infrared detector. In this case, a temperature-programmed desorption spectrum of generated carbon monoxide is measured, and oxygen detected at a measuring temperature of 1100° C. or lower is assumed to be attached oxygen. The difference between the concentration of the above residual oxygen and the concentration of the attached oxygen is the "concentration of the residual oxygen excluding the attached oxygen".

Preferably, the AlN sintered body of the present invention does not substantially contain metal elements other than aluminum. The metal elements other than aluminum include various impurity metals contained in the raw material powder, metals originating in the residual sintering aid and the like, and they are, for example, Ca, Fe, Y, Si, Ti, Ni, Cr, Na, rare earth metal elements and the like. The concentration of the above metal elements other than aluminum in the AlN sintered body of the present invention is preferably 100 ppm or less, more preferably 90 ppm or less and particularly preferably 50 ppm or less in total. A lower concentration of the impurity metal elements is more preferred, and therefore the lower limit thereof is not specifically restricted. However, a technical limit value thereof in terms of production is about 40 ppm. Rare earth metals generally used as a sintering aid for an AlN sintered body, for example, Y, Er, Sm, La, Yb and the like are not particularly substantially contained. The concentration of the rare earth elements in the AlN sintered body of the present invention is preferably 1 ppm or less, more preferably 0.5 ppm or less and particularly preferably 0.1 ppm or less. A lower concentration of the impurity metal elements is more preferred, and therefore the lower limit thereof shall not specifically be restricted. However, a technical limit value thereof in terms of production is about 0.01 ppm.

The concentration of the above metal elements is determined by TOP emission spectrometry.

The AlN sintered body of the present invention is of high purity as described above, and the oxygen concentration and the concentration of the impurity metal elements stay in a very low level. Such a high-purity AlN sintered body is obtained, as described later, by sintering an AlN powder in a very strong reducing atmosphere using an alkaline earth aluminate as a sintering aid. Although formation of the reducing atmosphere is achieved by using carbon, it is also preferred that the AlN sintered body of the present invention has a low level of a concentration of residual carbon. That is, a concentration of the residual carbon in the AlN sintered body of the present invention is preferably 150 ppm or less, more preferably 100 ppm or less and particularly preferably 80 ppm or less. A lower concentration of the residual carbon is more preferred, and therefore the lower limit thereof shall not specifically be restricted. However, the technical limit value thereof in terms of production is about 50 ppm.

The concentration of the residual carbon is determined by burning the AlN sintered body in an oxygen flow to produce a gas and detecting $CO_2$ contained in the gas by means of a non-dispersive infrared detector.

Next, a production process for the AlN sintered body according to the present invention shall be explained with reference to a specific embodiment thereof.

The AlN sintered body according to the present invention is obtained by molding a mixture of AlN powder and a prescribed amount of alkaline earth aluminate into a prescribed form (for example, tabular) and sintering the resulting molded product under a strong reducing atmosphere.

The AlN powder used as the raw material is preferably a high-purity powder, and to be specific, the AlN powder having a concentration of residual oxygen (including attached oxygen) of 0.9% or less is used. The concentration of the impurity metal elements other than aluminum in the above AlN powder is preferably 50 ppm or less.

A lower concentration of the above residual oxygen is more preferred, and therefore the lower limit thereof is not specifically restricted. However, a technical limit value thereof in terms of production is about 0.5%.

A lower concentration of the impurity metal elements other than aluminum in the AlN powder used as the raw material is more preferred as well, and therefore the lower limit thereof is not specifically restricted. However, a technical limit value thereof in terms of production is about 20 ppm.

A powder produced by a reduction nitriding method, a direct nitriding method or a gas phase method can be used as the raw material AlN powder. A powder produced by the reduction nitriding method or the gas phase method is preferred in terms of a low concentration of residual oxygen. The reduction nitriding method is more preferred in terms of a lower concentration of the residual oxygen and the impurity metal elements.

The alkaline earth aluminate used as the sintering aid includes, to be specific, $3CaO.Al_2O_3$, $CaO.Al_2O_3$, $12CaO.Al_2O_3$, $CaO.2Al_2O_3$ and the like, and includes particularly preferably $3CaO.Al_2O_3$.

The amount of the alkaline earth aluminate blended into the raw material AlN powder is 0.6 to 2.1 mole, preferably 0.8 to 1.8 mole in terms of an alkaline earth metal atom per mole of an oxygen atom contained in the aluminum nitride powder.

If the blend amount of the alkaline earth aluminate is too small, oxygen originating in the raw material powder remains in the sintered body, whereby the concentration of the residual oxygen is elevated. If the blend amount of the alkaline earth aluminate is excessive, oxygen and metal elements originating in the sintering aid remain in the sintered body, and the concentration of the residual oxygen and the concentration of the impurity metal elements are elevated.

The AlN powder may be mixed with the alkaline earth aluminate by a publicly known method. For example, a method for mixing by means of a mixing equipment such as a ball mill according to a dry or wet process may suitably be employed. A dispersing medium such as alcohols, hydrocarbons is used in wet mixing, and alcohols or hydrocarbons are preferably used from the viewpoint of dispersibility.

In the above mixing, from the viewpoint of preventing the alkaline earth aluminate from moisture absorption or aggregation, it is preferred to mix the alkaline earth aluminate powder with the AlN powder immediately after the alkaline earth aluminate powder is stored in dry air and, if necessary, is subjected to vacuum drying.

Prior to sintering, above described mixed powder is molded into a prescribed form according to the uses. Such molding may be carried out by a publicly known method, and may be carried out using an organic binder in order to prepare a molded product having a high strength and to enhance the yield.

For example, the mixed powder is mixed with an organic binder and, if necessary, a dispersant, a plasticizer, a solvent or the like to prepare a slurry or a paste for molding, and a molded product may be prepared from the slurry or paste for molding by a molding means such as a doctor blade method, an extrusion molding method, an injection molding method and a cast molding method. Examples of the organic binder include butyral resins such as polyvinyl butyral and acryl resins such as polybutyl methacrylate. The organic binders may be used in an amount of 0.1 to 30 parts by weigh, particularly 1 to 15 parts by weigh per 100 parts by weigh of the aluminum nitride powder. Examples of the dispersant include Glycerins. Isopropyl alcohol, hydrocarbons and the like are used as the solvent.

The molded product may be obtained as well by spraying the slurry by a spray drying method to prepare granules and then molding the granules by a press molding method.

Further, molding may be carried out as well by a compression molding method without using the organic binder. For example, a temporary molded product is prepared from a mixed powder of an aluminum nitride powder with a sintering aid powder by means of a monoaxial molding machine, and is subjected to pressure molding by means of a CIP (cold isotactic press) molding machine at 100 to 400 MPa, whereby a molded product is obtained.

The molded product thus obtained is burned after degreasing (removing the binder).

Although degreasing can be carried out by heating in an arbitrary atmosphere of air, nitrogen, hydrogen or the like, it is preferable to carry out degreasing in the air in which the amount of residual carbon is liable to be controlled. The degreasing temperature is varied according to the kind of the organic binder, and it is usually 300 to 900° C., particularly preferably 300 to 700° C. When molding is carried out without using an organic binder as is the case with a compression molding method, the degreasing step is unnecessary.

Next, the molded product is sintered to obtain the AlN sintered body of the present invention. Sintering is carried out in a strong reducing atmosphere.

A carbon-made vessel is used as a vessel for sintering, and the molded product is put in the vessel and heated in a nitrogen flow, whereby the atmosphere becomes strong reducing. The carbon-made vessel is a vessel in which at least the inner surface is made of carbon. The molded product is put in the vessel preferably so that the molded product is not brought into direct contact with the vessel. To be specific, the AlN molded product is prevented from being brought into direct contact with the carbon-made vessel by such a means that a boron nitride sintered body is placed as a floor plate in the vessel and the molded product is put thereon, or that boron nitride powder is spread in the vessel and the molded product is put thereon. When the molded product is sintered in a state in which the molded product is not brought into direct contact with the vessel as described above, the amount of carbon introduced into the sintered body is reduced, whereby an AlN sintered body having a high impurity is obtained.

Sintering is preferably carried out at a temperature of 1700 to 2100° C., preferably 1750 to 2000° C. and more preferably 1800 to 1900° C. for 10 to 100 hours, preferably 20 to 80 hours and more preferably 30 to 70 hours.

The AlN sintered body according to the present invention is obtained by passing through the sintering step described above.

In the production process of the present invention, the alkaline earth aluminate which is the sintering aid is used in a relatively large blend amount as compared with a conventional production process for an AlN sintered body. Use of the alkaline earth aluminate in a relatively large amount makes it possible to notably reduce the concentration of residual oxygen contained in the resulting sintered body. Although not theoretically restricted, the present inventors consider the following reason thereof. That is, in the sintering step, the alkaline earth aluminate is reacted with aluminum oxide (alumina) contained in the AlN powder to form a liquid phase, and oxygen contained in the AlN powder is discharged to a grain boundary of the AlN crystal in the form of composite oxide. As a result, the AlN crystal is purified. Oxygen contained in the AlN powder is thoroughly removed by using the alkaline earth aluminate in a relatively large amount, whereby a high-purity AlN crystal is obtained.

On the other hand, oxygen contained in the raw material powder is discharged outside the AlN crystal in the form of composite oxide with the alkaline earth aluminate. The composite oxide is then volatilized by sintering in a strong reducing atmosphere and removed outside the sintered body. As a result, oxygen originating in the raw material powder and oxygen and metal components originating in the alkaline earth aluminate are removed, whereby a high-purity AlN sintered body is obtained.

The AlN sintered body of the present invention thus obtained is used as a raw material for crystal growth in a method for growing an aluminum nitride single crystal by a sublimation method, a sputtering target for forming an aluminum nitride thin film and a raw material vessel for molecular beam epitaxial growth.

EXAMPLES

The present invention will be explained below with reference to examples without limiting the scope of the invention.

Measuring properties in the examples and the comparative examples were carried out by the following methods.

1) Concentration of Residual Oxygen (Including Attached Oxygen):

By means of an oxygen/nitrogen simultaneous analyzer (EMGA-550A) manufactured by HORIBA Ltd., AlN was molten in an inert gas by an impulse heating melting method to extract oxygen and the extract oxygen was converted to carbon monoxide. Resulting carbon monoxide was measured by means of a non-dispersive infrared detector. He gas (purity: 99.995% or more) was used as a carried gas.

2) Concentration of Residual Oxygen (Excluding Attached Oxygen):

A temperature-programmed desorption spectrum of oxygen and nitrogen in a temperature range of room temperature to 3000° C. was obtained by means of an oxygen/nitrogen simultaneous analyzer (EMGA-620W/C) manufactured by HOIBA Ltd. to separate attached oxygen from oxygen which was solid-solubilized in the crystal grain boundary and the crystal. Oxygen detected at 1100° C. or lower was assumed to be attached oxygen.

3) Metal Concentration:

Nitric acid and phosphoric acid were added to a crushed powder of AlN ceramics, and the crushed powder was heated and decomposed to measure the concentration of impurity metals (metals other than Al) contained in the AlN ceramics by an ICP emission spectrometry by means of ICPS-1000-II manufactured by HORIBA Ltd.

4) Concentration of Residual Carbon:

A crushed powder of AlN ceramics was burned in an oxygen flow by means of a carbon-in-metal analyzer (EMIA-110) manufactured by HORIBA Ltd. Carbon dioxide contained in generated gas was detected by means of a non-dispersive infrared detector to measure a carbon concentration.

Example 1

Into a nylon-made pot having a content volume of 2.4 L, put was a nylon ball (surface hardness: 100 kgf/mm$^2$ or less, density: 3.5 g/cm$^3$) having a diameter of 15 mm in which an iron core was covered with nylon. Next, added thereto were 100 parts by weight of AlN powder prepared by a reduction nitriding method and having an average particle diameter of 1.3 µm, a specific surface area of 3.39 m$^2$/g, an oxygen concentration (including that of attached oxygen) of 0.8 wt % and a metal element concentration of 35 ppm and a calcium aluminate compound ($Ca_3Al_2O_6$), as a sintering aid powder, having an average particle diameter of 1.8 µm and a specific surface area of 3.75 m$^2$/g in such an amount that a mole number of a calcium atom was 0.6 mole per mole of oxygen contained in the AlN powder. Then, 40 parts by weight of ethanol as a solvent was added thereto and they were wet-mixed. In this case, the nylon ball accounted for 40% (apparent volume) of the content volume of the pot. Mixing was carried out at 70 rpm in terms of a revolution of the pot for 3 hours. Further, a slurry thus obtained was dried to obtain an aluminum nitride powder.

Next, 10 g of the aluminum nitride powder thus obtained was temporarily molded into a molded product having a diameter of 40 mm and a thickness of 6 mm by means of a monoaxial molding machine, and then a load of 300 MPa was applied thereon by means of a CIP molding machine to carry out principal molding.

A molded product obtained by the operation described above was placed in a carbon-made vessel using an aluminum-made setter so that the molded product was not brought into contact with the carbon-made vessel, and was burned at a burning temperature of 1880° C. for 50 hours in nitrogen atmosphere to obtain a sintered body having a diameter of 30 mm and a thickness of 5 mm. It is considered that a reducing substance (carbon originating in the carbon-made vessel) was contained in the burning atmosphere. The production conditions of the aluminum nitride sintered body and the characteristics of the obtained aluminum nitride sintered body are shown in Table 1.

Example 2

The same operation as in Example 1 was carried out except that a mole number of a calcium atom contained in the sintering aid was 0.9 mole per mole of oxygen contained in the AlN powder. The production conditions of the aluminum nitride sintered body and the characteristics of the obtained aluminum nitride sintered body are shown in Table 1.

Example 3

The same operation as in Example 1 was carried out except that a mole number of a calcium atom contained in the sintering aid was 1.2 mole per mole of oxygen contained in the AlN powder. The production conditions of the aluminum nitride sintered body and the characteristics of the obtained aluminum nitride sintered body are shown in Table 1.

Example 4

The same operation as in Example 1 was carried out except that a mole number of a calcium atom contained in the sintering aid was 1.5 mole per mole of oxygen contained in the AlN powder. The production conditions of the aluminum nitride sintered body and the characteristics of the obtained aluminum nitride sintered body are shown in Table 1.

Example 5

The same operation as in Example 1 was carried out except that a mole number of a calcium atom contained in the sintering aid was 2.1 mole per mole of oxygen contained in the AlN powder. The production conditions of the aluminum nitride sintered body and the characteristics of the obtained aluminum nitride sintered body are shown in Table 1.

Example 6

The same operation as in Example 3 was carried out except that the burning time was 30 hours. The production conditions of the aluminum nitride sintered body and the characteristics of the obtained aluminum nitride sintered body are shown in Table 1.

Example 7

The same operation as in Example 3 was carried out, except that the burning time was 100 hours. The production conditions of the aluminum nitride sintered body and the characteristics of the obtained aluminum nitride sintered body are shown in Table 1.

Example 8

The same operation as in Example 3 was carried out except that the burning temperature was 1800° C. The production conditions of the aluminum nitride sintered body and the characteristics of the obtained aluminum nitride sintered body are shown in Table 1.

Example 9

The same operation as in Example 3 was carried out except that the sintering aid was $CaO.Al_2O_3$. The production conditions of the aluminum nitride sintered body and the characteristics of the obtained aluminum nitride sintered body are shown in Table 1.

Example 10

The same operation as in Example 3 was carried out except that the burning temperature was 2000° C. The production conditions of the aluminum nitride sintered body and the characteristics of the obtained aluminum nitride sintered body are shown in Table 1.

Example 11

The same operation as in Example 3 was carried out except that AlN powder having an average particle diameter of 1.7 μm, a specific surface area of 2.0 m²/g, an oxygen concentration (including attached oxygen) of 0.6 wt % and a metal elements concentration of 34 ppm which was produced by a gas phase method was used as the AlN powder. The production conditions of the aluminum nitride sintered body and the characteristics of the obtained aluminum nitride sintered body are shown in Table 1.

Comparative Example 1

The same operation as in Example 1 was carried out except that the sintering aid was not added. The production conditions of the aluminum nitride sintered body and the characteristics of the obtained aluminum nitride sintered body are shown in Table 1.

Comparative Example 2

The same operation as in Example 1 was carried out except that a mole number of a calcium atom contained in the sintering aid was 0.15 mole per mole of oxygen contained in the AlN powder. The production conditions of the aluminum nitride sintered body and the characteristics of the obtained aluminum nitride sintered body are shown in Table 1.

Comparative Example 3

The same operation as in Example 1 was carried out except that a mole number of a calcium atom contained in the sintering aid was 3 moles per mole of oxygen contained in the AlN powder. The production conditions of the aluminum nitride sintered body and the characteristics of the obtained aluminum nitride sintered body are shown in Table 1.

Comparative Example 4

The same operation as in Example 3 was carried out except that the burning temperature was 1680° C. The production conditions of the aluminum nitride sintered body and the characteristics of the obtained aluminum nitride sintered body are shown in Table 1.

Comparative Example 5

The same operation as in Example 3 was carried out except that the sintering aid was $Y_2O_3$. The production conditions of the aluminum nitride sintered body and the characteristics of the obtained aluminum nitride sintered body are shown in Table 1.

Comparative Example 6

The same operation as in Example 3 was carried out except that the sintering aid was $Y_2O_3$ and that the molded product was burned in a neutral atmosphere. The production conditions of the aluminum nitride sintered body and the characteristics of the obtained aluminum nitride sintered body are shown in Table 1.

Comparative Example 7

The same operation as in Example 3 was carried out except that the molded product was burned in a neutral atmosphere. The production conditions of the aluminum nitride sintered body and the characteristics of the obtained aluminum nitride sintered body are shown in Table 1.

Comparative Example 8

The same operation as in Example 3 was carried out except that AlN powder having an average particle diameter of 1.6 μm, a specific surface area of 3.7 m²/g, an oxygen concentration (including that of attached oxygen) of 1.2 wt % and a metal elements concentration of 130 ppm which was produced by a direct nitriding method was used as the AlN powder. The production conditions of the aluminum nitride sintered body and the characteristics of the obtained aluminum nitride sintered body are shown in Table 1.

TABLE 1

| | | Production process of AlN sintered body | | | | | | Characteristics of AlN sintered body Impurity concentration | | | | |
|---|---|---|---|---|---|---|---|---|---|---|---|---|
| | | AlN powder Concentration of residual oxygen % | Sintering aid | | Burning conditions | | | residual oxygen | residual oxygen excluding attached oxygen | residual carbon | metal impurities | Y |
| | No. | | Kind*¹ | M/AlN(O)*² | Temperature °C. | Time hour | Atmosphere | ppm | ppm | ppm | ppm | ppm |
| Example | 1 | 0.8 | C3A | 0.6 | 1880 | 50 | Reducing $N_2$ | 500 | 350 | 140 | 43 | <0.5 |
| | 2 | 0.8 | C3A | 0.9 | 1880 | 50 | Reducing $N_2$ | 400 | 280 | 140 | 50 | <0.5 |
| | 3 | 0.8 | C3A | 1.2 | 1880 | 50 | Reducing $N_2$ | 200 | 140 | 80 | 47 | <0.5 |
| | 4 | 0.8 | C3A | 1.5 | 1880 | 50 | Reducing $N_2$ | 300 | 210 | 70 | 43 | <0.5 |
| | 5 | 0.8 | C3A | 2.1 | 1880 | 50 | Reducing $N_2$ | 500 | 350 | 120 | 45 | <0.5 |
| | 6 | 0.8 | C3A | 1.2 | 1880 | 30 | Reducing $N_2$ | 300 | 210 | 130 | 45 | <0.5 |
| | 7 | 0.8 | C3A | 1.2 | 1880 | 100 | Reducing $N_2$ | 200 | 140 | 80 | 40 | <0.5 |
| | 8 | 0.8 | C3A | 1.2 | 1800 | 30 | Reducing $N_2$ | 500 | 350 | 150 | 51 | <0.5 |
| | 9 | 0.8 | CA | 1.2 | 1880 | 30 | Reducing $N_2$ | 400 | 280 | 140 | 48 | <0.5 |

TABLE 1-continued

| | | Production process of AlN sintered body | | | | | | Characteristics of AlN sintered body Impurity concentration | | | | |
|---|---|---|---|---|---|---|---|---|---|---|---|---|
| | | AlN powder Concentration of residual oxygen % | Sintering aid | | Burning conditions | | | residual oxygen ppm | residual oxygen excluding attached oxygen ppm | residual carbon ppm | metal impurities ppm | Y ppm |
| | No. | | Kind*[1] | M/AlN(O)*[2] | Temperature °C. | Time hour | Atmosphere | | | | | |
| | 10 | 0.8 | C3A | 1.2 | 2000 | 50 | Reducing $N_2$ | 200 | 140 | 60 | 38 | <0.5 |
| | 11 | 0.6 | C3A | 1.2 | 1880 | 50 | Reducing $N_2$ | 200 | 140 | 150 | 50 | <0.5 |
| Comparative Example | 1 | 0.8 | (none) | — | 1880 | 50 | Reducing $N_2$ | 2700 | 2600 | 200 | 50 | <0.5 |
| | 2 | 0.8 | C3A | 0.15 | 1880 | 50 | Reducing $N_2$ | 1200 | 1100 | 170 | 55 | <0.5 |
| | 3 | 0.8 | C3A | 3 | 1880 | 50 | Reducing $N_2$ | 3000 | 2900 | 190 | 70 | <0.5 |
| | 4 | 0.8 | C3A | 1.2 | 1680 | 50 | Reducing $N_2$ | 22000 | 21500 | 180 | 27000 | <0.5 |
| | 5 | 0.8 | $Y_2O_3$ | 1.2 | 1880 | 50 | Reducing $N_2$ | 800 | 700 | 200 | 2400 | 2340 |
| | 6 | 0.8 | $Y_2O_3$ | 1.2 | 1880 | 50 | Neutral $N_2$ | 13000 | 12900 | 210 | 31000 | 30950 |
| | 7 | 0.8 | C3A | 1.2 | 1880 | 50 | Neutral $N_2$ | 25000 | 24900 | 200 | 20000 | <0.5 |
| | 8 | 1.2 | C3A | 1.2 | 1880 | 50 | Reducing $N_2$ | 1500 | 1400 | 170 | 160 | <0.5 |

*[1]C3A = $Ca_3Al_2O_6$ (3CaO·$Al_2O_3$), CA = $CaAl_2O_4$ (CaO·$Al_2O_3$)
*[2]mole number of an alkaline earth metal atom or a rare earth metal atom in a sintering aid per mole of oxygen atom in AlN powder Industrial Applicability According to the present invention, provided is an aluminum nitride sintered body which is reduced in the amount of oxygen and metal components originating in a raw material powder and a sintering aid and which is of high purity.

The above high-purity aluminum nitride sintered body can preferably be used as a raw material for growing single crystal by a sublimation method.

The invention claimed is:

1. An aluminum nitride sintered body having a concentration of residual oxygen excluding attached oxygen of 350 ppm or less and having a concentration of rare earth metal elements of 1 ppm or less.

2. The aluminum nitride sintered body as described in claim 1, having a concentration of residual oxygen including attached oxygen of 700 ppm or less and not substantially containing metal elements other than aluminum.

3. The aluminum nitride sintered body as described in claim 2, having a concentration of the metal components other than aluminum of 100 ppm or less in total.

* * * * *